(12) United States Patent
Chiang

(10) Patent No.: US 6,405,343 B1
(45) Date of Patent: Jun. 11, 2002

(54) ECC Q-PARITY CHECKBYTE INDEXING

(75) Inventor: Kevin Chiang, Fremont, CA (US)

(73) Assignee: Oak Technology, Inc., Sunnyvale, CA (US)

( * ) Notice: Subject to any disclaimer, the term of this patent is extended or adjusted under 35 U.S.C. 154(b) by 0 days.

(21) Appl. No.: 09/304,521

(22) Filed: May 4, 1999

(51) Int. Cl.[7] .................... G06F 11/00; H03M 13/00
(52) U.S. Cl. .................. 714/804; 714/755; 714/701
(58) Field of Search ............................... 714/755, 756, 714/804, 701

(56) References Cited

U.S. PATENT DOCUMENTS

| | | | | |
|---|---|---|---|---|
| 4,375,100 A | * | 2/1983 | Tsuji et al. .................. | 714/755 |
| 4,680,764 A | * | 7/1987 | Suzuki et al. ................ | 714/756 |
| 4,710,923 A | * | 12/1987 | Nagumo ..................... | 714/701 |
| RE33,462 E | * | 11/1990 | Suzuki et al. ................ | 714/756 |
| 4,998,252 A | * | 3/1991 | Suzuki et al. ................ | 714/756 |
| 5,408,477 A | * | 4/1995 | Okada et al. ................ | 714/755 |
| 5,412,667 A | * | 5/1995 | Havemose ................... | 714/756 |
| 6,041,431 A | * | 3/2000 | Goldstein .................... | 714/784 |

* cited by examiner

Primary Examiner—Phung M. Chung
Assistant Examiner—Joseph Torres
(74) Attorney, Agent, or Firm—John Schipper

(57) ABSTRACT

System and method for improved formation of a Q-parity checkbyte matrix used for error control for a sequence of message bytes and error control bytes, using an algorithm, rather than a lookup table, to determine the order of the words used for the sequence. Entries of a Reed-Solomon parity check rectangular array are set up sequentially and diagonally, including the syndrome bytes and checkbytes to be used for error detection, so that all matrix entries can be written to, or read from, a computer memory in a stream of bytes whose order is determined by the algorithm without reference to a lookup table.

12 Claims, 6 Drawing Sheets

|     | $N_P =$ 0 | 1 | 2 |  | 41 | 42 |
|---|---|---|---|---|---|---|
| $M_P = 0$ | 0000 | 0001 | 0002 | .... .... .... | 0041 | 0042 |
| 1 | 0043 | 0044 | 0045 | .... .... .... | 0084 | 0085 |
| 2 | 0086 | 0087 | 0088 | .... .... | 0127 | 0128 |
| 3 | 0129 | 0130 | 0131 | .... | | 0171 |
| 4 | 0172 | 0173 | .... | Q | | 0214 |
| ⋮ | | | | | | ⋮ |
| 22 | 0946 | 0947 | 0948 | .... 0986 | 0987 | 0988 |
| 23 | 0989 | 0990 | 0991 | .... 1029 | 1030 | 1031 |
| 24 | 1032 | 1033 | 1034 | ..... 1072 | 1073 | 1074 |
| 25 | 1075 | 1076 | 1077 | ..... 1115 | 1116 | 1117 |

Rows 24–25: P-PARITY

*Fig. 1A*

| 26 | 1118 1119 1120 .... 1143 |
| --- | --- |
| 27 | 1144 1145 1146 .... 1169 |

0   1   2   •   25

Rows 26–27: Q-PARITY

*Fig. 1B*

| | n2=0 | 1 | 2 | · | · | 40 | 41 | 42 | S0 | S1 |
|---|---|---|---|---|---|---|---|---|---|---|
| n1= 0 | 0000 | 0044 | 0088 | .... | .... | 0642 | 0686 | 0730 | 1118 | 1144 |
| 1 | 0043 | 0087 | 0131 | .... | .... | 0685 | 0729 | 0773 | 1119 | 1145 |
| 2 | 0086 | 0130 | 0147 | .... | .... | 0728 | 0772 | 0816 | 1120 | 1146 |
| 3 | 0129 | 0137 | 0217 | .... | .... | 0771 | 0815 | 0859 | 1121 | 1147 |
| 4 | 0172 | 0216 | 0260 | .... | .... | 0814 | 0858 | 0902 | 1122 | 1148 |
| · | | | | | | | | | · | |
| · | | | | | | | | | · | |
| · | | | | | | | | | · | |
| 22 | 0946 | 0990 | 1034 | .... | .... | 0470 | 0514 | 0558 | 1140 | 1166 |
| 23 | 0989 | 1033 | 1077 | .... | .... | 0513 | 0557 | 0601 | 1141 | 1167 |
| 24 | 1032 | 1076 | 0002 | .... | .... | 0556 | 0600 | 0644 | 1142 | 1168 |
| 25 | 1075 | 0001 | 0045 | .... | .... | 0599 | 0643 | 0687 | 1143 | 1169 |

Q-PARITY

*Fig. 2*

ECC Q-PARITY CHECKBYTE INDEXING

FIELD OF THE INVENTION

This invention relates to indexing of parity checkbytes and the associated message bytes for digital message error control operations.

BACKGROUND OF THE INVENTION

One method of error control for digital signals uses P-parity and Q-parity checkbytes to provide a means of identifying the presence of, and location of one or more errors in a digital message. The error correction code (ECC) used in this approach is a product code over the Galois field $GF(2^8)$, where each byte is a symbol and a word consists of two bytes (MSB and LSB, or "upper" and "lower"). Consecutive words in a block are numbered n=0, 1, . . . , 1169, and the numbering begins immediately following the end of the sync pattern or other preamble. The entire block, excluding the sync pattern, is protected against (some) errors by the ECC. Column code words and row code words are referred to as P(parity)-words and Q(parity)-words, respectively.

In a conventional approach, the elements $s_{i,j}$ for a P-parity matrix and/or the Q-parity matrix are written to and read from a lookup table one at a time. These operations are repetitive but are treated as if they are individually defined. What is needed is an approach that takes advantage of the repetitive nature of the operations to obtain a sequence of read or write operations that can be performed in less time and with less logic hardware. Preferably, the approach should be flexible enough to permit its application to any size parity matrices and with any reasonable primitive polynomial equation that may be chosen.

SUMMARY OF THE INVENTION

These needs are met by the invention, which sets up an sequence of identical read (or write) operations in which the argument or index increases or decreases in a definable manner. An approach is implemented that writes to, or reads from, an entire Q-parity data sequence (1170 entries) in an ordered manner. A Q-parity data sequence includes all the data entries in a P-parity sequence but uses a diagonal format so that the entries appear in a non-intuitive and mixed-up order. The approach accounts for this and for the looping back of the data elements representing the Q-parity sequence. The entries can be written in a burst mode format that reduces the time required to process all the entries.

BRIEF DESCRIPTION OF THE DRAWINGS

FIGS. 1A, 1B and 2 illustrate the desired action for reading to, or writing from, a sequence of entries for a P-parity word and a Q-parity word.

DESCRIPTION OF THE INVENTION

Figure 3A:
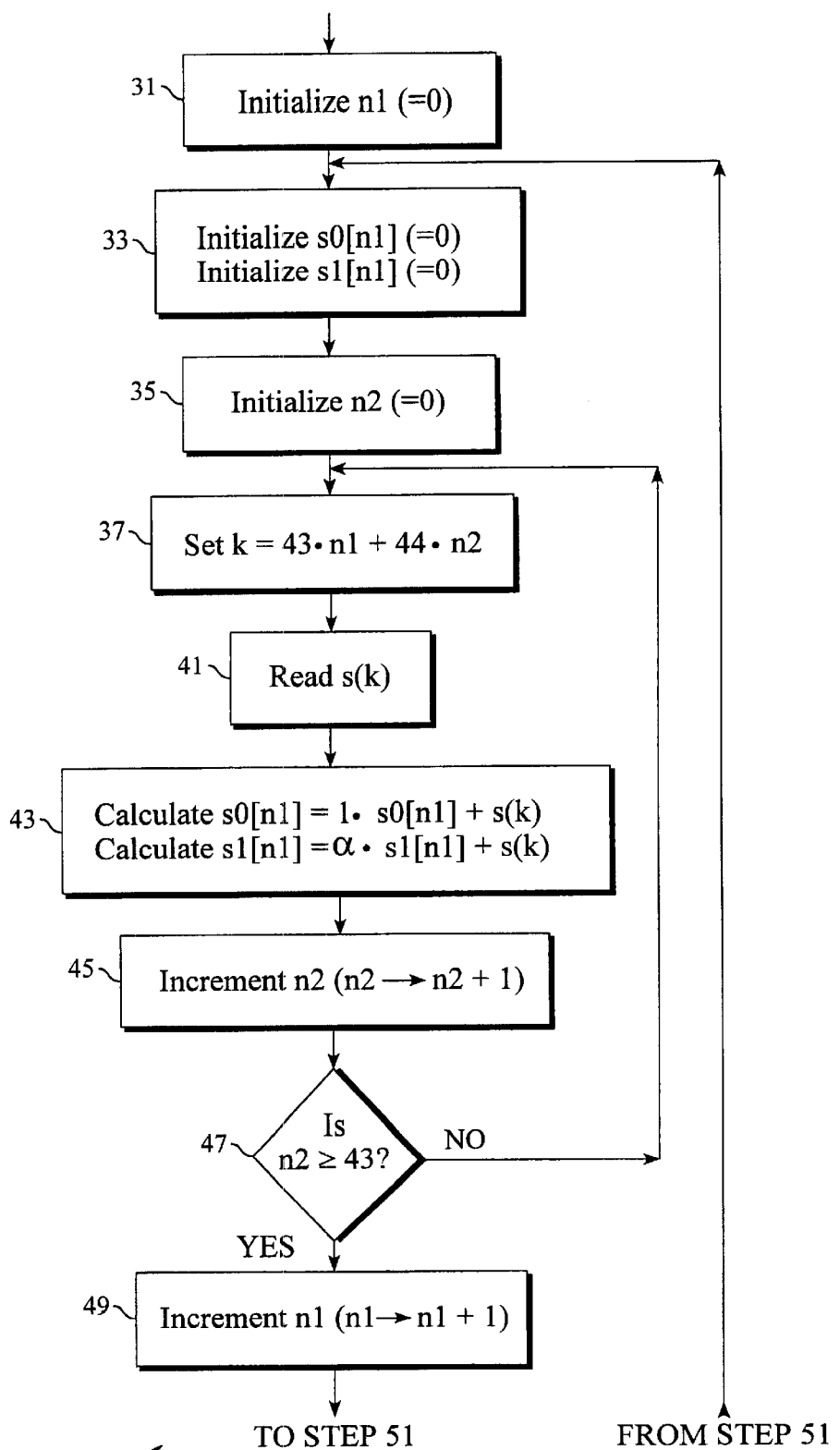
FIGS. 3 and 4 are flow charts illustrating use of the invention to perform a Q-parity error control processing operation, such as read or write.

FIG. 1A illustrates a data element array, expressed as a parity matrix $(s_{i,j})$ ($0 \leq i \leq 25$; $0 \leq j \leq 42$) of 26 rows and 43 columns, used in parity-based error control for digital signals. Each entry s(r) (r=0, 1, 2, . . . , 1031) in the rows of the array or matrix, numbered 0, 1, . . . , 23 (1032 entries), is part of the sequence of digital signal bytes that make up a block of the "bare" message, without error control bytes appended. Each entry in the rows numbered 24 and 25 (86 entries, numbered 1032, 1033, . . . , 1117) is part of a P-parity checkbyte appended to the "bare" message for ECC (error correction) action. As indicated in FIG. 1A, the P-parity indices Mp and Np have the ranges $0 \leq Mp \leq 25$ and $0 \leq Np \leq 42$ and are assigned in a straightforward manner using sequences defined along horizontal rows (Np) or vertical columns (Mp). Two Q-parity checkbytes with entries s(r), shown in FIG. 1B are included as part of the error control procedure: Q0, with entries numbered r=1118, 1119, . . . , 1143, and Q1, with entries numbered r=1144, 1145, . . . , 1169.

FIG. 1A also indicates the assignment of Q-parity indices, which are determined using sequences of entries that are defined along each of 26 diagonals, with each complete diagonal having 43 entries. Each diagonal includes 43 entries, beginning at a different position on the left side of the array for each new pass. For example, the addresses of the 43 entries in the first diagonal Q(0) of the array shown in FIG. 1A are, in order: 0000, 0044, 0088, 0132, 0176, 0220, 0264, 0308, 0352, 0396, 0440, 0484, 0528, 0572, 0616, 0660, 0704, 0748, 0792, 0836, 0880, 0924, 0968, 1012, 1056, 1100, 0026, 0070, 0114, 0158, 0202, 0246, 0290, 0334, 0378, 0422, 0466, 0510, 0554, 0598, 0642, 0686, 0730, after application of a (modulo 1118) operation.

An entry s(n1,n2), of a diagonal sequence in FIG. 1A is determined by $$s(n1,n2)=s(k), \quad (1)$$

$$k=k(n1,n2)=(43 \cdot n1+44 \cdot n2)(\text{mod } 1118), \quad (2)$$

where the sum of the two subscripted indices is computed modulo 1118 to compensate for passage of each diagonal sequence through the array more than once.

FIG. 1B shows the addresses (1118, 1119, . . . , 1169) of the next 52 entries, which serve as memory cells for two ECC Q-parity segments, each 26 words in length.

FIG. 2 illustrates a rearrangement of the original 26×43 table to show more clearly how Q-parity indices, n1 and n2, can be employed for Q-parity computations. Each Q-parity sequence is now one of the 26 (horizontal) rows of 45 entries in the array shown in FIG. 2, including the P-parity checkbyte components corresponding to the data element addresses 1032, 1033, . . . , 1117. The data element addresses 1118, . . . , 1143 and 1144, . . . , 1169 will hold the components for the Q-parity checkbytes Q0 and Q1.

The ECC Q-parity check involves powers $\alpha^n$ (n=0, 1, . . . , 7) of an eight-bit primitive $\alpha$, that satisfies a selected primitive polynomial relation $$p(\alpha)=0. \quad (3)$$

For example, the primitive polynomial relation may be selected to be $$p(\alpha)=\alpha^8+\alpha^4+\alpha^3+\alpha^2+1=0, \quad (4)$$

in which event the "0" element, the "1" element and several powers of $\alpha$ become $0=\{0,0,0,0,0,0,0,0\}$, $\alpha^0=\{0,0,0,0,0,0,0,1\}(="1")$, $\alpha=\{0,0,0,0,0,0,1,0\}$, $\alpha^2=\{0,0,0,0,0,1,0,0\}$, $\alpha^3=\{0,0,0,0,1,0,0,0\}$, $\alpha^4 = \{0,0,0,1,0,0,0,0\}$, $\alpha^5 = \{0,0,1,0,0,0,0,0\}$, $\alpha^6 = \{0,1,0,0,0,0,0,0\}$, $\alpha^7 = \{1,0,0,0,0,0,0,0\}$, $\alpha^8 = \{0,0,0,0,1,1,1,0\} = \alpha^4 + \alpha^3 + \alpha^2 + 1$, $\alpha^9 = \{0,0,1,1,1,0,1,0\} = \alpha \cdot \alpha^8 = \alpha^5 + \alpha^4 + \alpha^3 + \alpha$, $\alpha^{25} = \{0,0,0,0,0,0,1,1\}$, $\alpha^{230} = \{1,1,1,1,0,1,0,0\}$, $\alpha^{231} = \{1,1,1,1,0,1,0,1\}$, $\alpha^{230} = \{1,1,1,1,0,1,1,1\}$, $\alpha^{255} = \alpha^0 = \{0,0,0,0,0,0,0,1\} = \text{"1"}$,   (5)

where the particular powers $\alpha^h$ (h=1, 230, 231, 232) will be needed in the following development. The remaining powers $\alpha^h$ (10≤h≤254) are generated using the particular primitive polynomial relation (4). Changing the choice of primitive polynomial will cause a corresponding change in definition of most of the powers of $\alpha$.

The particular checkbytes Q0 and Q1 are formed as follows. Two syndrome variables s0 and s1 are defined generally by $$s0[n1] = \sum_{n2=0}^{M-1} 1 \cdot s(((M+1) \cdot n2 + M \cdot n1)(\mod M \cdot N)) \quad (6)$$

$$s1[n1] = \sum_{n2=0}^{M-1} \alpha^{M-1-n2} \cdot s(((M+1) \cdot n2 + M \cdot n1)(\mod M \cdot N)) \quad (7)$$

for n1=0, 1, ..., N−1, where the choices M=43 and N=26 correspond to a particular choice for Q-parity error correction. Two check bytes, Q0 and Q1, are added for every code word to detect up to two errors per code word and to allow correction of up to one error per code word.

The check bytes Q0 and Q1 satisfy the error check relations $Q1[n1]+Q0[n1]+s0[n1]=0$,   (8)

$Q1[n1]+\alpha Q0[n1]+\alpha^2 s1[n1]=0$.   (9)

One verifies from the relations (5), (8) and (9) that $Q1[n1]=Q0[n1]+s0[n1]$,   (10)

$(1+\alpha) \cdot Q0[n1]=s0[n1]+\alpha^2 \cdot s1[n1]$   (11)

$Q0[n1]=(1+\alpha)^{-1}\{s0[n1]+\alpha^2 \cdot s1[n1]\}=\alpha^{-25}\{s0[n1]+\alpha^{-25+2} \cdot s1[n1]\}$ $=\alpha^{255-25} \cdot s0[n1]+\alpha^{255-23} \cdot s1[n1]=\alpha^{230} \cdot s0[n1]+\alpha^{232} \cdot s1[n1]$,   (12)

$Q1[n1]=\alpha^{231} \cdot s0[n1]+\alpha^{232} \cdot s1[n1]$.   (13)

Each data element received by an ECC-Q-parity processor is a 16-bit array or word, consisting of a "high end" byte and a "low end" byte that are associated with each other. The procedure shown in FIGS. 3 or 4 will also work if each data element is an 8-bit array or byte. As a word (two bytes) of data arrives, the word is received simultaneously by a syndrome-0 processor unit and by a syndrome-1 processor unit. These processor units produce a contribution to the Q-parity syndromes s0 and s1 defined in relations (6) and (7), for later computation of the Q-parity checkbytes Q0 and Q1. The contributions of this received word to the syndromes s0 and s1 are added to the partial sums for s0 and s1 already in memory, and the new partial sums are returned to memory. This continues until each data element in the 26×43 array has been received and its contributions to the sums s0 and s1 have been computed and added to the partial sums for s0 and s1. Preferably, each row of entries in the 26×43 array in FIG. 2 is read as a unit so that the contributions from each row to the checkbytes Q0 and Q1 are computed as a unit.

Figure 3B:
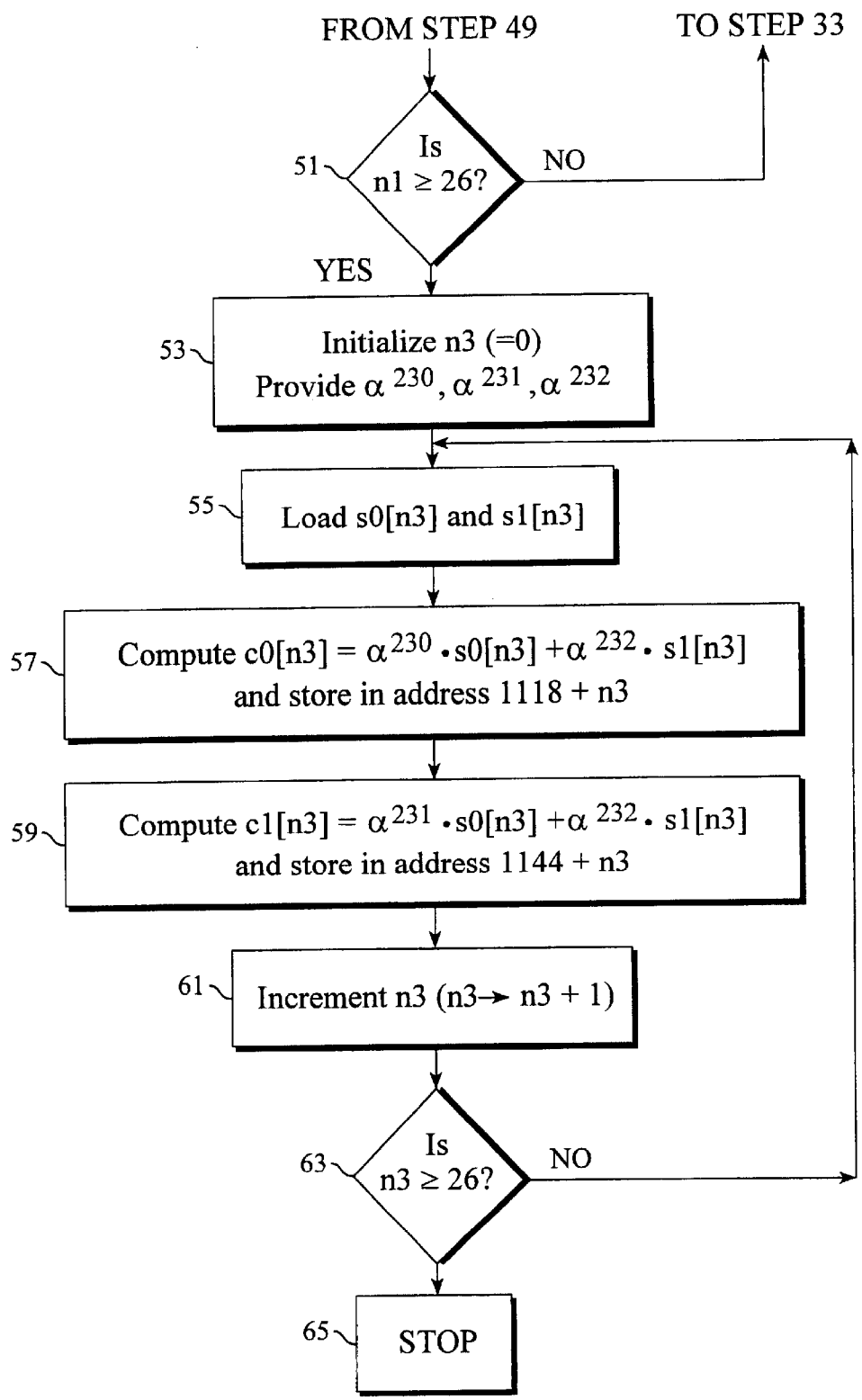

The invention provides an abbreviated procedure for loading and processing ECC checkbyte entries for error control. The abbreviated procedure may be expressed as follows.

eccq_index_s: starting index
1.1 reset eccq_index_s to 0
1.2 when 0≤n1≤24, n2=42:
    eccq_index_s=eccq_index_s+43
eccq_index: address index
2.1 n2=1:
    eccq_index=eccq_index_s+44:
2.2 2≤n2≤42 and eccq_index+44≤1118:
    eccq_index=eccq_index+44
2.3 2≤n2≤42 and eccq_index+44≥1118:
    eccq_index=eccq_index+44−1118
3 When n1=0, use s00 and s10 to store the syndrome
4 When n1=n (≥1), use s0n and s1n to store the syndrome
5 Use burst mode to write checkbyte back to memory
6 Set n2=43 and n1=0, 1, ..., 25; write Q0 to memory
7 Set n2=44 and n1=0, 1, ..., 25; write Q1 to memory FIG. 3 is a flow chart illustrating one embodiment of the invention. It is assumed here that the "bare" data entries s(k) (k=0, 1, 2, ..., 1031) are to be processed by being written to, or read from, the first 1032 entries of the 26×43 array as shown in FIG. 1, that first and second P-parity syndrome sequences correspond to the next two rows of 43 entries s(k) (k=1032, 1033, ..., 1074 and k=1075, 1076, ..., 1117), that the 44th column (FIG. 2) corresponds to the checkbyte Q0 with entries s(k) (k=1118, 1119, ..., 1143), and that the 45th column (FIG. 2) corresponds to the checkbyte Q1 with entries s(k) (k=1144, 1145, ..., 1169). The entire sequence of words s(k) (k=0, 1, 2, ..., 1169), each consisting of an "upper" byte $s(k)_U$ and a "lower" byte $s(k)_L$, is to be read from the 1118 addresses of the 26×43 array shown in FIG. 1A, processed to determine the checkbyte entries for Q0 and Q1, and these checkbyte entries are to be written to 52 addresses in a 2×26 array, as shown in FIG. 1B.

In step 31 of FIG. 3, a first counting index n1 is initialized (n1=0). In step 33, two sequences, s0[n1] and s1[n1], of 16-bit arrays are initialized for a second counting index n2 (s0[n1]=0 and s1[n1]=0) and a selected 8-bit variable $\alpha$ is provided. In step 35, the second counting index n2 is initialized (n2=0). In step 37, a composite counting index k=k(n1,n2), defined in (2), is optionally computed.

In steps 41–43, a sequence of data entries s(k) is read in and processed. In step 41, the system reads a data element or word s(k), a 16-bit variable including a low end byte and a high end byte. In step 43, the system calculates s0[n1]= 1·s0[n1]+s(k) and s1[n1]=α·s1[n1]+s(k) for high end and low end bytes, where the 8-bit arrays designated as 1 and α are set forth in the relation (5).

In step 45, the index n2 is incremented (n2→n2+1). In step 47 the system determines whether n2≥43? If the answer to the question in step 47 is "no," the system returns to step 37 and repeats the procedure in steps 37, 41, 43, 45 and 47 at least once, using the now-incremented value for the second index n2.

If the answer to the question in step 47 is "yes," the system re-initializes the second index (n2=0) and increments the first index n1 in step 49 (n1→n1+1). In step 51 the system determines whether n1≧26? If the answer to the question in step 51 is "no," the system returns to step 33, using the now-incremented first index n1, re-initializes the quantities s0[n1], s1[n1] and n2 (all=0) for the new value of n1, and repeats the procedure in steps 33, 35, 37, 41, 43, 45, 47, 49 and 51 at least once, using the now-incremented value for the first index n1.

If the answer to the question in step 51 is "yes," the system initializes a third counting index n3 (n3=0) and loads or otherwise provides selected powers $\alpha^h$ of the $\alpha$ variable (e.g., $\alpha^{230}$, $\alpha^{231}$, $\alpha^{232}$), at step 53. The system provides s0[n3] and s1[n3] at step 55. At step 57, the system computes Q0[n3]=$\alpha^{230}$·s0[n3]+$\alpha^{232}$·s1[n3] and stores Q0[n3] in address 1118+n3. At step 59, the system computes Q1[n3]=$\alpha^{231}$·s0[n3]+$\alpha^{232}$·s1[n3], and stores Q1[n3] in address 1144+n3. The index n3 is incremented at step 61 (n3→n3+1). At step 63, the system determines whether n3≧26? If the answer to the question in step 63 is "no," the system returns to step 55 at least once and repeats the steps 55, 57, 59, 61 and 63 at least once. If the answer to the question in step 63 is "yes," the procedure optionally stops, at step 65. The steps 55, 57, 59, 61 and 63 can be performed together in at most two clock cycles. The two sequences {Q0[n3]} and {Q1[n3]} serve as Q-parity checkbyte components for the data element sequence.

Although this method is arranged to scan a 26×43 (or 26×45) rectangular array of numbers in a diagonally oriented manner, the method can be extended to diagonally scan an M×N rectangular array of numbers (M≦N−1) in a similar manner. In FIG. 3, the choices N=26, M=43 and R=M·N=1118 are made.

Figure 4A:
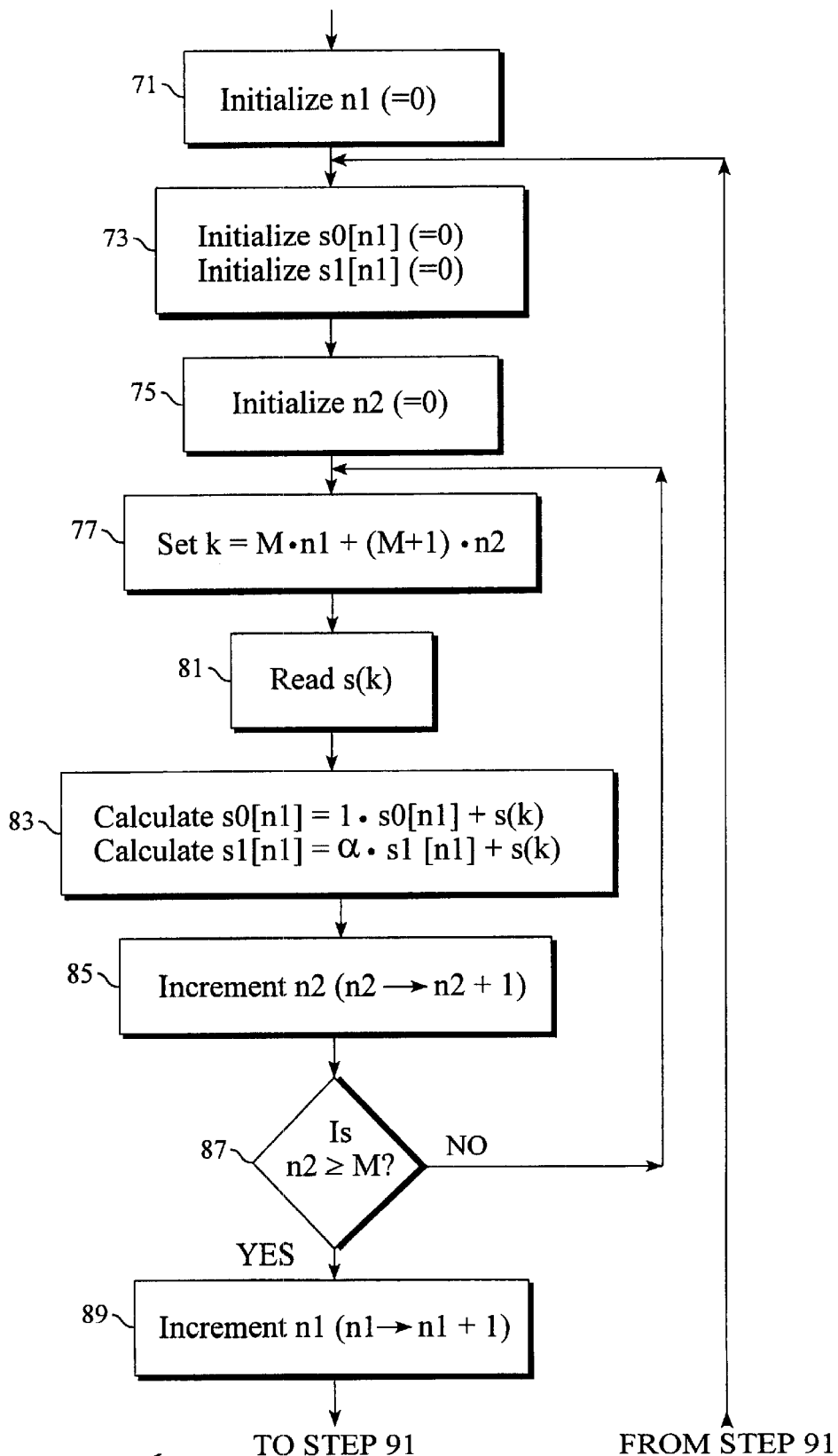
Figure 4B:
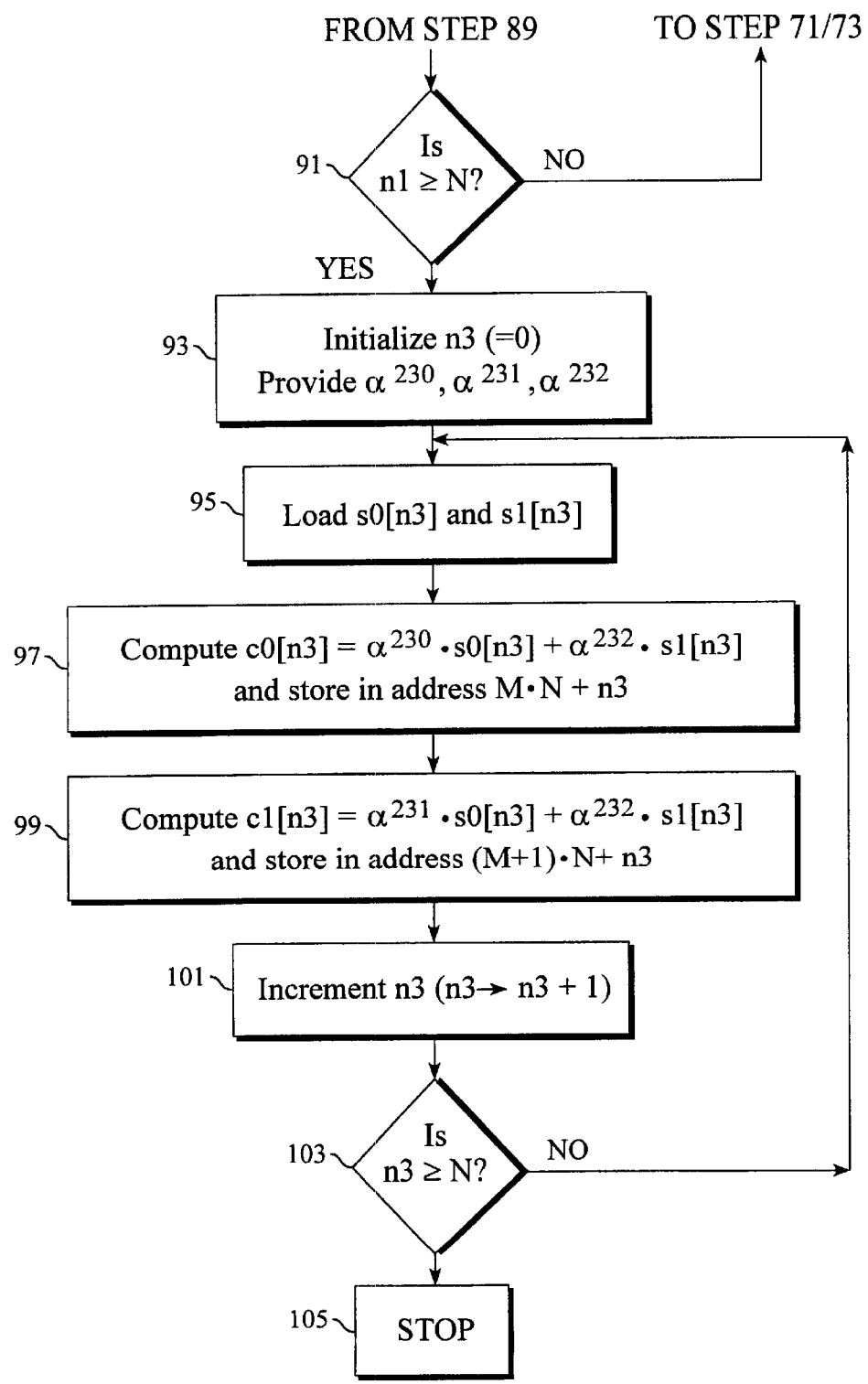

FIG. 4 illustrates this extension of the method, with steps 71, 73, 75, 77, 81, 83, 85, 87, 89, 91, 93, 95, 97, 99, 101, 103 and 105 being analogous to the corresponding respective steps 31, 33, 35, 37, 41, 43, 45, 47, 49, 51, 53, 55, 57, 59, 61, 63 and 65. In step 77, the counting index k defined in the relation (2) is replaced by the index $$k'(n1,n2)=(M·n1+(M+1)·n2)(\bmod\ M·N); \quad (14)$$

in step 8, the question becomes "Is n2≧M?"; in step 91, the question becomes "Is n1≧N?"; and in step 103, the question becomes "Is n3≧N?" In steps 97 and 99, the addresses for storage become M·N+n3 and M·(N+1)+n3, respectively. In most other respects, the flow chart shown in FIG. 3 remains the same. Further, the initial address number, 0000, may be replaced by any other reasonable address number, with suitable changes in other addresses being made to account for the changed initial address.

What is claimed is:

1. A method for formation of Q-parity checkbyte values used for error control for a sequence of digital signal bytes that form a message, the method comprising:

providing a sequence of R=M·N digital signal elements s(r), numbered r=0, 1, ..., R−1, where M and N are selected positive integers;

for a selected value of a first index n1 in the range n1=0, 1, ..., N−1, receiving a first initial K-bit array s0{n1}=1·s(n1·M) and a second initial K-bit array s1{n1}=α·s(n1·M), where K is 8 or 16;

initializing a second index n2=0;

for n1 fixed and n2=0, 1, ..., M−1, forming a first sequence s0{n1}=s0{n1}+1·s((n1·M+n2·(M+1)) (mod R)) and a second sequence s1{n1}=α·s1{n1}+s((n1·M+n2·(M+1)) (mod R)), where 1 and α are first and second selected K-bit arrays;

repeating the preceding two steps for each of the sequence of values of n1=0, 1, ..., N−1; and processing the sequences {s0{n3}} and {s1{n3}}, with n3=0, 1, ..., N−1, to form first and second Q-parity checkbyte arrays {Q0{n3}} and {Q1{n3}} associated with the digital signal elements s(r), by a procedure comprising:

providing selected powers $\alpha^h$ of the array $\alpha$, with h=230, 231, 232;

initializing the index n3=0;

forming the first and second arrays, Q0(n3) and Q1(n3), according to the relations Q0{n3}=$\alpha^{230}$·s0{n3}+$\alpha^{232}$·s1{n3} and Q1{n3}=$\alpha^{231}$·s0{n3}+$\alpha^{232}$·s1{n3}, for n3=0, 1, ..., N−1; and interpreting the arrays {Q0{n3}} and {Q1{n3}} as Q-parity checkbytes associated with the digital signal elements s(r).

2. The method of claim 1, further comprising selecting said array a to satisfy a polynomial equation P(α)=$\alpha^8$+$\alpha^4$+$\alpha^3$+$\alpha^2$+1=0.

3. The method of claim 1, further comprising selecting said integers M and N to be M=43 and N=26.

4. A system for formation of Q-parity checkbyte values used for error control for a sequence of digital signal bytes that form a message, the system comprising:

a source of digital signal values that provides a sequence of R=M·N digital signal values s(r), numbered r=0, 1, ..., R−1, where M and N are selected positive integers; and a digital computer that is programmed:

for a selected value of a first index n1 in the range n1=0, 1, ..., N−1, to receive a first initial K-bit array s0{n1}=1·s(n1·M) and a second initial K-bit array s1{n1}=α·s(n1·M), and to provide first and second selected eight-bit arrays 1 and α, where K is 8 or 16;

to initialize a second index n2=0;

for n1 fixed and n2=0, 1, ..., M−1, to form a first sequence s0{n1}=s0{n1}+1·s((n1·M+n2·(M+1)) (mod R)) and a second sequence s1{n1}=α·s1{n1}+s((n1·M+n2·(M+1)) (mod R));

to repeat the preceding two steps for each of the sequence of values of n1=0, 1, ..., N−1; and to process sequences {s0{n3}} and {s1{n3}]}, with n3=0, 1, ..., N−1, to form first and second Q-parity checkbyte arrays {Q0{n3}} and {Q1{n3}} associated with the digital signal elements s(r), by a procedure comprising:

providing selected powers $\alpha^h$ of the array $\alpha$, with h=230, 231, 232;

initializing the index n3=0;

forming the first and second arrays, Q0(n3) and Q1(n3), according to the relations Q0{n3}= $\alpha^{230}$·s0{n3}+$\alpha^{232}$·s1{n3} and Q1{n3}= $\alpha^{231}$·s0{n3}+$\alpha^{232}$·s1{n3}, for n3=0, 1, ..., N−1; and interpreting the arrays {Q0{n3}} and {Q1{n3}} as Q-parity checkbytes associated with the digital signal elements s(r).

5. The system of claim 4, wherein said array a is selected to satisfy a polynomial equation P(α)=$\alpha^8$+$\alpha^4$+$\alpha^3$+$\alpha^2$+1=0.

6. The system of claim 4, wherein said integers M and N are selected to be M=43 and N=26.

7. A method for formation of Q-parity checkbyte values used for error control for a sequence of digital signal bytes that form a message, the method comprising:

providing a sequence of $R=M \cdot N$ digital signal elements $s(r)$, numbered $r=0, 1, \ldots, R-1$, where M and N are selected positive integers;

for a selected value of a first index n1 in the range $n1=0, 1, \ldots, N-1$, receiving a first initial K-bit array $s0\{n1\}=1 \cdot s(n1 \cdot N)$ and a second initial K-bit array $s1\{n1\}=\alpha \cdot s(n1 \cdot N)$ at first and second registers of a digital computer, and providing a first selected K-bit array 1 and selected powers $\alpha^h$ of a second selected K-bit array $\alpha$, with h=1, 230, 231 and 232, where K is 8 or 16;

initializing a second index n2=0;

for n1 fixed and $n2=0, 1, \ldots, M-1$, forming a first sequence $s0\{n1\}=s0\{n1\}+1 \cdot s((n1 \cdot M+n2 \cdot (M+1)) \pmod R)$ in the first register and a second sequence $s1\{n1\}=\alpha \cdot s1\{n1\}+s((n1 \cdot M+n2 \cdot (M+1)) \pmod R)$ in the second register;

repeating the preceding two steps for each of the sequence of values of $n1=0, 1, \ldots, N-1$; and processing sequences $\{s0\{n3\}\}$ and $\{s1\{n3\}\}$, with $n3=0, 1, \ldots, N-1$, to form first and second Q-parity checkbyte arrays $\{Q0\{n3\}\}$ and $\{Q1\{n3\}\}$ associated with the digital signal elements $s(r)$, by a procedure comprising:

initializing the index n3=0;

forming the first and second arrays, Q0(n3) and Q1(n3), at the first and second registers, respectively, according to the relations $Q0\{n3\}=\alpha^{230} \cdot s0\{n3\}+\alpha^{232} \cdot s1\{n3\}$ and $Q1\{n3\}=\alpha^{231} \cdot s0\{n3\}+\alpha^{232} \cdot s1\{n3\}$, for $n3=0, 1, \ldots, N-1$; and interpreting the arrays $\{Q0\{n3\}\}$ and $\{Q1\{n3\}\}$ as Q-parity checkbytes associated with the digital signal elements $s(r)$.

8. The method of claim 7, further comprising selecting said array a to satisfy a polynomial equation $P(\alpha)=\alpha^8+\alpha^4+\alpha^3+\alpha^2+1=0$.

9. The method of claim 7, further comprising selecting said integers M and N to be M=43 and N=26.

10. A system for formation of Q-parity checkbyte values used for error control for a sequence of digital signal bytes that form a message, the system comprising:

a source of digital signal values that provides a sequence of $R=M \cdot N$ digital signal values $s(r)$, numbered $r=0, 1, \ldots, R-1$, where M and N are selected positive integers with $M \leq N$; and a digital computer that is programmed:

for a selected value of a first index n1 in the range $n1=0, 1, \ldots, N-1$, to receive a first initial K-bit array $s0\{n1\}=1 \cdot s(n1 \cdot N)$ and a second initial K-bit array $s1\{n1\}=\alpha \cdot s(n1 \cdot N)$ at first and second registers of a digital computer, and to provide a first selected K-bit array 1 and selected powers $\alpha^h$ of a second selected K-bit array $\alpha$, with h=1, 230, 231 and 232, where K is 8 or 16;

to initialize a second index n2=0;

for n1 fixed and $n2=0, 1, \ldots, M-1$, to form a first sequence $s0\{n1\}=s0\{n1\}+1 \cdot s((n1 \cdot M+n2 \cdot (M+1)) \pmod R)$ in the first register and a second sequence $s1\{n1\}=\alpha \cdot s1\{n1\}+s((n1 \cdot M+n2 \cdot (M+1)) \pmod R)$ in the second register;

to repeat the preceding two steps for each of the sequence of values of $n1=0, 1, \ldots, N-1$; and to process sequences $\{s0\{n3\}\}$ and $\{s1\{n3\}\}$, with $n3=0, 1, \ldots, N-1$, to form first and second Q-parity checkbyte arrays $\{Q0\{n3\}\}$ and $\{Q1\{n3\}\}$ associated with the digital signal elements $s(r)$, by a procedure comprising:

initializing the index n3=0;

forming the first and second arrays, $Q0\{n3\}$ and $Q1\{n3\}$, at the first and second registers, respectively, according to the relations $Q0\{n3\}=\alpha^{230} \cdot s0\{n3\}+\alpha^{232} \cdot s1\{n3\}$ and $Q1\{n3\}=\alpha^{231} \cdot s0\{n3\}+\alpha^{232} \cdot s1\{n3\}$, for $n3=0, 1, \ldots, N-1$; and interpreting the arrays $\{Q0\{n3\}\}$ and $\{Q1\{n3\}\}$ as Q-parity checkbytes associated with the digital signal elements $s(r)$.

11. The system of claim 10, wherein said computer is further programmed to select said array a to satisfy a polynomial equation $P(\alpha)=\alpha^8+\alpha^4+\alpha^3+\alpha^2+1=0$.

12. The system of claim 10, wherein said computer is further programmed to select said integers M and N to be M=43 and N=26.

* * * * *